United States Patent
Matsuki

[19]

[11] Patent Number: 6,121,083
[45] Date of Patent: Sep. 19, 2000

[54] SEMICONDUCTOR DEVICE AND METHOD OF FABRICATING THE SAME

[75] Inventor: Takeo Matsuki, Tokyo, Japan

[73] Assignee: NEC Corporation, Tokyo, Japan

[21] Appl. No.: 09/134,394

[22] Filed: Aug. 14, 1998

[30] Foreign Application Priority Data

Aug. 21, 1997 [JP] Japan ..................................... 9-224950

[51] Int. Cl.$^7$ ....................... H01L 21/8242; H01L 21/20; H01L 21/44
[52] U.S. Cl. ........................................... 438/254; 438/672
[58] Field of Search .................................... 438/192, 239, 438/240, 253, 255, 396, 398, 256, 637, 639, 666, 624, 720, 724, 672; 257/306, 307, 310, 311

[56] References Cited

U.S. PATENT DOCUMENTS

| | | | |
|---|---|---|---|
| 5,330,614 | 7/1994 | Ahn | 438/396 |
| 5,335,138 | 8/1994 | Sandhu et al. | 361/303 |
| 5,459,345 | 10/1995 | Okudaira et al. | 257/310 |
| 5,464,793 | 11/1995 | Roehl | 438/672 |
| 5,567,964 | 10/1996 | Kashihara et al. | 257/310 |
| 5,612,574 | 3/1997 | Summerfelt et al. | 257/783 |
| 5,854,104 | 12/1998 | Onishi et al. | 438/240 |

FOREIGN PATENT DOCUMENTS

| | | |
|---|---|---|
| 2-232961 | 9/1990 | Japan . |
| 7-38068 | 2/1995 | Japan . |
| 9-116123 | 5/1997 | Japan . |

*Primary Examiner*—Chandra Chaudhari
*Assistant Examiner*—Brook Kebede
*Attorney, Agent, or Firm*—Hutchins, Wheeler & Dittmar

[57] ABSTRACT

There is provided a semiconductor device including (a) a semiconductor substrate, (b) a capacity device, (c) an interlayer insulating layer formed between the semiconductor substrate and the capacity device for electrically isolating them with each other, the interlayer insulating layer being formed below the capacity device with a contact hole therethrough, (d) a contact plug composed of an electrically conductive material and formed in the contact hole, (e) a first film composed of a first material through which hydrogen is not allowed to pass, and formed between the interlayer insulating layer and capacity device, (f) a second film composed of a second material through which hydrogen is not allowed to pass, and formed on an inner wall of the contact hole, (g) a third film composed of a third material through which hydrogen is not allowed to pass, and formed to cover an upper surface of the capacity device therewith, and (h) a fourth film composed of a fourth material through which hydrogen is not allowed to pass, and formed to cover a side surface of the capacity device therewith. The first, second, third, and fourth materials are silicon nitride, for instance. Since a capacity device having a capacitive film composed of metal oxide readily reduced by hydrogen is entirely covered with first to fourth films, which are composed of silicon nitride, for instance, it is possible to avoid the capacitive film from being reduced, which ensures that the capacitive film is not deteriorated.

9 Claims, 16 Drawing Sheets

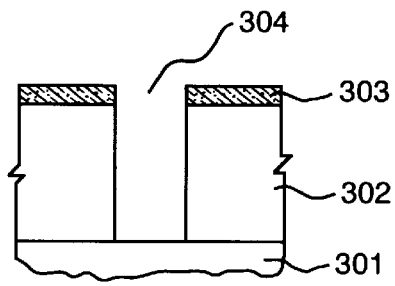
FIG. 4A
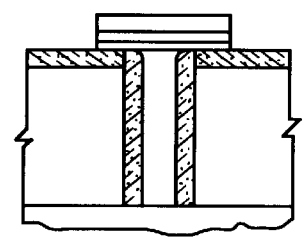
FIG. 4F
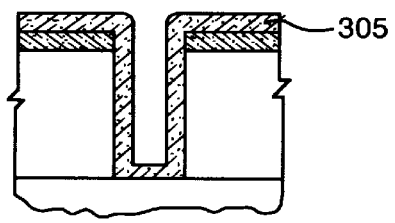
FIG. 4B
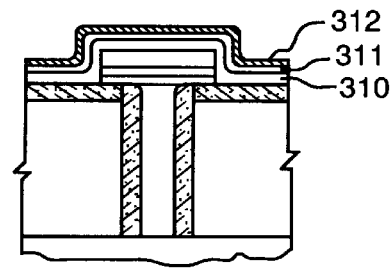
FIG. 4G
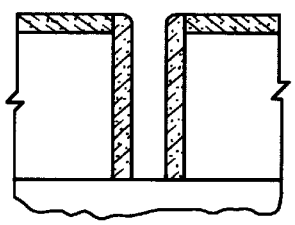
FIG. 4C
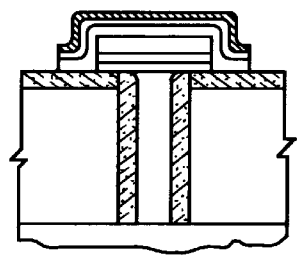
FIG. 4H
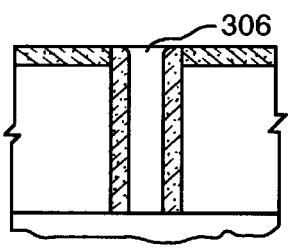
FIG. 4D
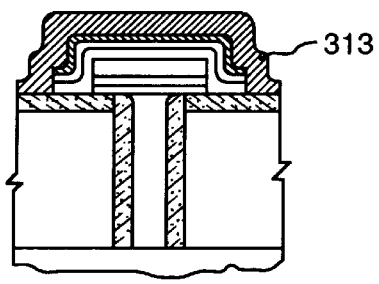
FIG. 4I
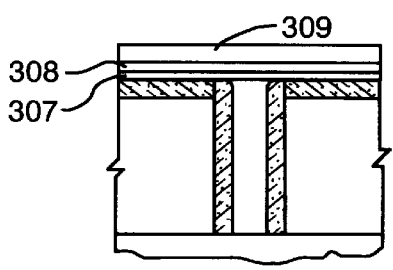
FIG. 4E
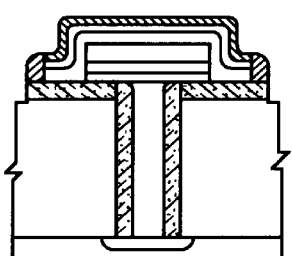
FIG. 4J
FIG. 4

SEMICONDUCTOR DEVICE AND METHOD OF FABRICATING THE SAME

BACKGROUND OF THE INVENTION

1. Field of the Invention

The invention relates to a semiconductor device and a method of fabricating the same.

2. Description of the Related Art

In these days, a semiconductor memory device has been required to operate at a higher rate, have a greater capacity for storing data therein, and operate in less power consumption. To such requirements, there has been suggested a dynamic random access memory (DRAM), which is much in demand now, having a capacitive or insulating film of a capacity device or a memory node which film is composed of metal oxides having a greater dielectric constant than that of a silicon dioxide film in order to make it possible to form memory cells in a circuit smaller. Some of such metal oxides are ferroelectric. There has been also suggested a non-volatile memory utilizing ferroelectric characteristics of those metal oxides.

Japanese Unexamined Patent Publication No. 7-38068 published on Feb. 7, 1995 has suggested a semiconductor memory device having a capacitive film composed of high-dielectric substance. FIG. 1 illustrates the suggested semiconductor memory device.

LOCOS oxide films 803 are formed at a surface of a silicon substrate 801 to thereby define a device formation region therein. Below LOCOS films 803 are formed channel stopper regions 804. Source/drain regions 802 are formed at a surface of the silicon substrate 801. Gate electrodes 805 acting as word lines are formed on LOCOS oxide films. A signal line 806 acting as a bit line is formed on the silicon substrate 801 between the source/drain regions 802.

An interlayer insulating film consisting of a silicon dioxide film 807 and a silicon nitride film 808 is formed on the silicon substrate 801. The interlayer insulating film is formed therethrough with contact holes 809 reaching the source/drain regions 802. Each of the contact holes 809 is filled with a plug 810 composed of an electrically conductive material such as metal.

A capacity device having a capacitive film composed of high-dielectric substance is formed on the interlayer insulating film. The capacity device is in electrical connection with the source/drain regions 802 through the plug 810. The silicon nitride film 808 and the plug 810 are both planarized at the same level.

The capacity device is comprised of a plurality of lower or storage electrodes 811, a capacitive insulating film 812 entirely covering the lower electrodes 811 therewith, and an upper or plate electrode 813 deposited all over the capacitive insulating film 812.

Over the upper electrode 813 are formed a metal wiring layer (not illustrated), and an interlayer insulating film 814 for electrically insulating the metal wiring layer and the upper electrode 813 with each other, to thereby constitute a semiconductor memory device.

After the metal wiring layer has been formed, the product is thermally annealed in hydrogen atmosphere in order to reduce a dispersion in a threshold voltage of transistors arranged on a surface of the silicon substrate, and a dispersion in a current for driving transistors. This thermal annealing compensates for defects, such as a trap level, formed at an interface between the capacity device and the interlayer insulating film making contact with the capacity device.

However, the above-mentioned semiconductor memory device illustrated in FIG. 1 has shortcomings as follows.

First, since the thermal annealing in hydrogen atmosphere is carried out after the capacity device has been formed, the capacitive film composed of metal oxide is unpreferably reduced with the result of deterioration of capacitive characteristics of the capacity device.

Secondly, transistors formed on layers located below a layer on which the capacity device is formed may be deteriorated with respect to performance and reliability thereof. Specifically, as illustrated in FIG. 1, since the silicon nitride film 808 entirely covers the silicon dioxide film 807 except the plugs 810, if the product is thermally annealed in hydrogen atmosphere after the capacity device has been formed, the silicon nitride film 808 acts as a barrier for hydrogen to reach layers on which transistors are formed. As a result, performance of transistors and reliability for transistors are deteriorated, and a characteristic of transistors is not uniformized.

SUMMARY OF THE INVENTION

In view of the above-mentioned problems in a conventional semiconductor memory device, it is an object of the present invention to provide a semiconductor device and a method of fabricating the same both of which are capable of avoiding a capacitive film composed of metal oxide from being degraded even if a capacity device is thermally annealed in hydrogen atmosphere.

In one aspect of the present invention, there is provided a semiconductor device including (a) a semiconductor substrate, (b) a capacity device, (c) an interlayer insulating layer formed between the semiconductor substrate and the capacity device for electrically isolating them with each other, the interlayer insulating layer being formed therethrough with a contact hole below the capacity device, (d) a contact plug composed of an electrically conductive material and formed in the contact hole, (e) a film composed of a material through which hydrogen is not allowed to pass, the film entirely covering both the capacity device and the contact plug therewith.

In accordance with the above-mentioned semiconductor device, both the capacity device which may include a capacitive film composed of metal oxide, and the contact plug electrically connecting the capacity device to the semiconductor substrate are entirely covered with a film composed of a material through which hydrogen is not allowed to pass. Hence, it is possible to prohibit hydrogen to reach the capacitive film.

There is further provided a semiconductor device including (a) a semiconductor substrate, (b) a capacity device, (c) an interlayer insulating layer formed between the semiconductor substrate and the capacity device for electrically isolating them with each other, the interlayer insulating layer being formed therethrough with a contact hole below the capacity device, (d) a contact plug composed of an electrically conductive material and formed in the contact hole, (e) a first film composed of a first material through which hydrogen is not allowed to pass, and formed between the interlayer insulating layer and the capacity device, (f) a second film composed of a second material through which hydrogen is not allowed to pass, and formed on an inner wall of the contact hole, (g) a third film composed of a third material through which hydrogen is not allowed to pass, and formed to cover an upper surface of the capacity device therewith, and (h) a fourth film composed of a fourth material through which hydrogen is not allowed to pass, and formed to cover a side surface of the capacity device therewith.

It is preferable that the first, second, third, and fourth materials are the same. The first, second, third, and fourth materials are preferably nitride, and more preferably silicon nitride.

It is preferable that the capacity device includes a capacitive film composed of tantalum oxide. As an alternative, the capacity device may include a capacitive film composed of high-dielectric or ferroelectric substance.

It is preferable that the contact hole electrically connects the capacity device to a source or drain region formed in the semiconductor substrate.

The semiconductor device may further include an upper electrode to be electrically connected to an external wiring, in which case, the upper electrode is located remote from the capacity device.

In another aspect of the present invention, there is provided a method of fabricating a semiconductor device, including the steps of (a) forming a multi-layered interlayer insulating film on a semiconductor substrate, the multi-layered interlayer insulating film including a first film, as an uppermost film, composed of a first material through which hydrogen is not allowed to pass, (b) forming a contact hole through the multi-layered interlayer insulating film to the semiconductor substrate, (c) forming a second film on an inner wall of the contact hole, the second film being composed of a second material through which hydrogen is not allowed to pass, (d) forming a plug layer in the contact hole, the plug layer being composed of an electrically conductive material, (e) forming a capacity device over the contact hole in such a manner that the capacity device is more extensive than a cross-section of the contact hole, (f) forming a third film on the capacity device in such a manner that an end surface of the third film, a side surface of the capacity device, and the first film are exposed, the third film being composed of a third material through which hydrogen is not allowed to pass, and (g) forming a fourth film covering both the end surface of the third film and the side surface of the capacity device therewith, the fourth film being composed of a fourth material through which hydrogen is not allowed to pass.

In accordance with the above-mentioned method, it is possible to cover a capacity device with the first to fourth films in the same number of photolithography steps as the number of photolithography steps in a conventional method.

For instance, the step (c) may include (c-1) forming the second film over the semiconductor substrate so that an inner wall of the contact hole is covered with the second film, and (c-2) etching the second film back so that only a portion of the second film deposited on the semiconductor substrate is removed.

The step (e) may include (e-1) forming a lower electrode on the semiconductor substrate over the plug layer in such a manner that the lower electrode is more extensive than a cross-section of the contact hole, (e-2) forming a capacitive film entirely covering the lower electrode therewith and further covering the first film therewith, and (e-3) forming an upper electrode over the capacitive film, the third film being formed on the capacitive film.

The step (g) may include (g-1) depositing the fourth film over the capacity device and the first film, and (g-2) etching the fourth and first films so that an upper surface and the end surface of the third film, and the side surface of the capacity device are covered with the fourth film.

There is further provided a method of fabricating a semiconductor device, including the steps of (a) forming a multi-layered interlayer insulating film on a semiconductor substrate, the multi-layered interlayer insulating film including a first film, as an uppermost film, composed of a first material through which hydrogen is not allowed to pass, (b) forming a plurality of contact holes in a row through the multi-layered interlayer insulating film to the semiconductor substrate, (c) forming a second film on an inner wall of the contact hole, the second film being composed of a second material through which hydrogen is not allowed to pass, (d) forming a plug layer in the contact hole, the plug layer being composed of an electrically conductive material, (e) forming a lower electrode on the semiconductor substrate over the plug layer in such a manner that the lower electrode is more extensive than a cross-section of the contact hole, (f) forming a capacitive film entirely covering the lower electrode therewith and further covering the first film therewith, (g) forming an upper electrode over the capacitive film, (h) forming a third film on the upper electrode, (i) etching the third film in such a manner that an end surface of the third film, a side surface of the upper electrode, a side surface of the capacitive film, and the first film are exposed, and that the upper electrode is co-owned by a plurality of the lower electrodes, the third film being composed of a third material through which hydrogen is not allowed to pass, and (j) forming a fourth film covering both the end surface of the third film and the side surface of the capacity device therewith, the fourth film being composed of a fourth material through which hydrogen is not allowed to pass.

In still another aspect of the present invention, there is provided a semiconductor memory device comprising a plurality of semiconductor devices each including a transistor and a capacity device, each of the semiconductor devices being fabricated in accordance with the above-mentioned method.

It is preferable that the semiconductor devices are arranged in a grid.

It is also preferable that a contact hole for electrically connecting the semiconductor memory device to an external wiring layer is formed outside the capacity device or a region where the semiconductor devices are arranged. In accordance with this embodiment, it is no longer necessary to form a contact hole, which electrically connects a capacity device or an upper electrode of a capacity device connected to transistors to an external wiring layer, in the vicinity of the capacity device. That is, if a contact hole connecting an upper electrode to an external wiring layer were formed in the vicinity of a capacity device, hydrogen would readily diffuse into the capacity device through the contact hole during thermal annealing in hydrogen atmosphere. To the contrary, by positioning a contact hole remote from a capacity device, it would be possible to avoid degradation of a capacity device.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 4A to 4J are cross-sectional views of a semiconductor device in accordance with the first embodiment, each illustrating respective step of a method of fabricating the same.

DESCRIPTION OF THE PREFERRED EMBODIMENTS

[First Embodiment]

Figure 1:
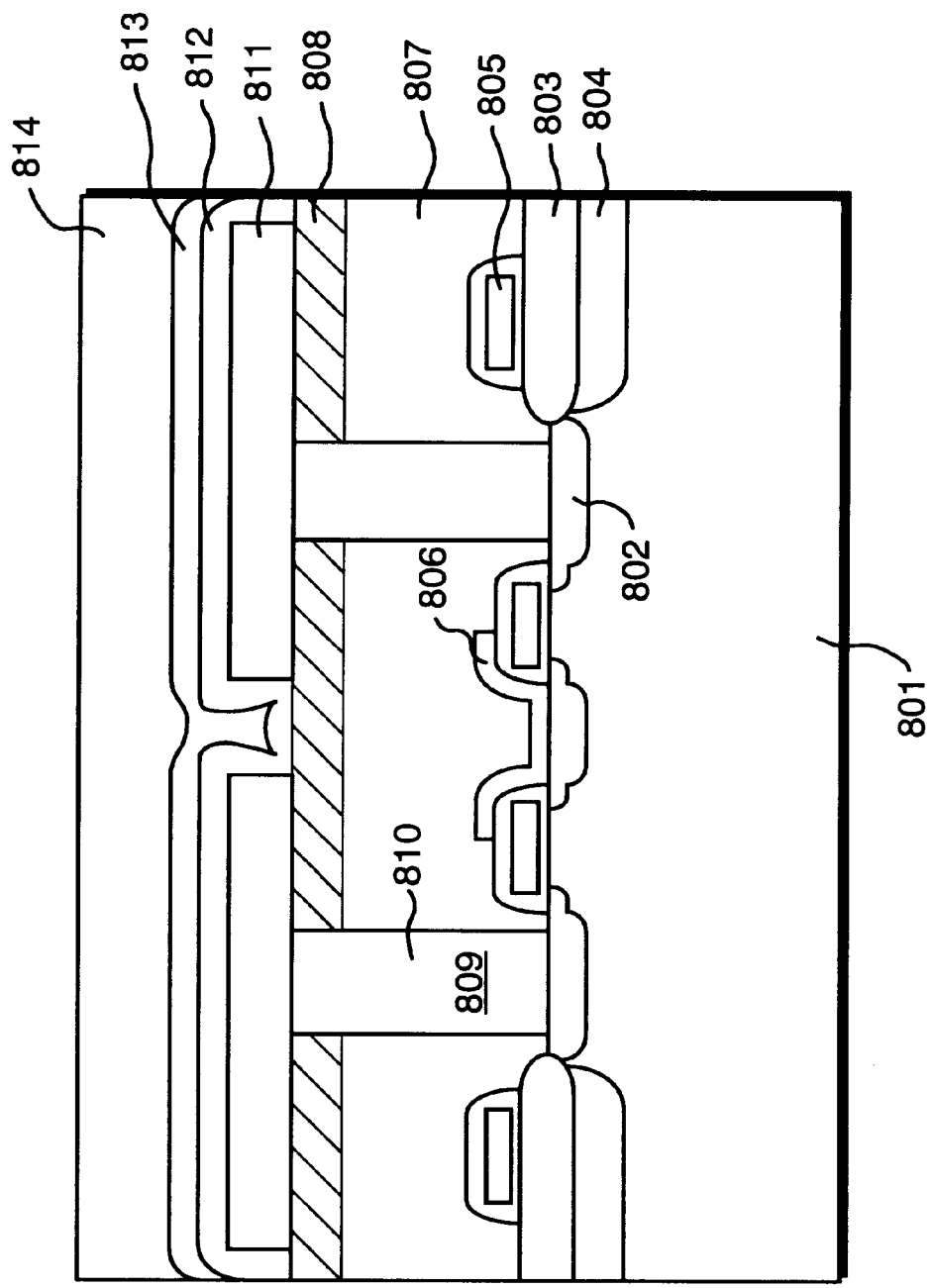
FIG. 1 is a cross-sectional view of a conventional semiconductor memory device.
Figure 2:
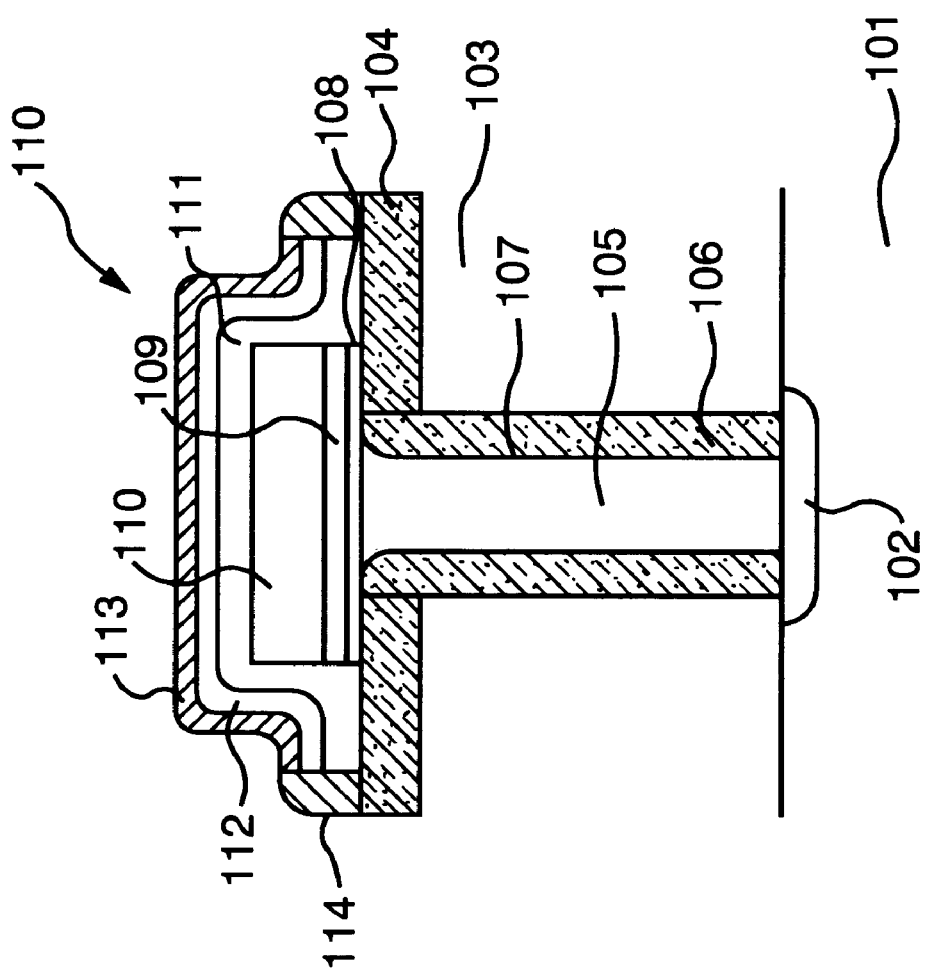
FIG. 2 is a cross-sectional view of a semiconductor device in accordance with the first embodiment of the present invention.

FIG. 2 illustrates a semiconductor device in accordance with the first embodiment. The illustrated semiconductor device comprises a silicon substrate 101, a capacity device 100, an interlayer insulating layer 103 formed between the silicon substrate 101 and the capacity device 100 for electrically isolating them with each other, and formed therethrough with a contact hole 105 below the capacity device 100, a contact plug 107 composed of an electrically conductive material and filled in the contact hole 105, a first silicon nitride film 104 formed between the interlayer insulating layer 103 and the capacity device 100, a second silicon nitride film 106 formed on an inner wall of the contact hole 105, a third silicon nitride film 113 formed to cover an upper surface of the capacity device 100 therewith, and a fourth silicon nitride film 114 formed to cover a side surface of the capacity device 100 therewith.

The capacity device 100 is comprised of a first layer 108 composed of titanium silicide ($TiSi_2$) and formed on the first silicon nitride film 104 entirely covering the contact hole 105 therewith, a second layer 109 composed of titanium nitride and formed on the first layer 108, a lower electrode layer 110 formed on the second layer 109, a capacitive film 111 entirely covering the first layer 108, the second layer 109, and the lower electrode 110 therewith, and an upper electrode layer 112 covering the capacitive film 111 therewith.

The capacity device 100 is spaced away from the silicon substrate 101 through the first silicon nitride film 104 and the interlayer insulating film 103 composed of silicon dioxide, but is electrically connected to the silicon substrate 101 through the contact hole 105 filled with the plug 107. The first silicon nitride film 104 covering a lower surface of the capacity device 100 therewith prevents hydrogen from passing through the lower electrode 110, and thereby prevents the capacitive film 111 from being degraded. When the capacitive film 111 is composed of metal oxide, the first silicon nitride film 104 also ensures to prevent generation of oxygen caused by reduction. If an oxygen gas is generated by reduction, the oxygen gas may cause layers of the capacity device 100 to peel off.

The contact hole 105 reaches the silicon substrate 101 at a region 102 into which impurities are heavily doped in order to reduce a junction resistance. The contact hole 105 may be designed to reach a metal wiring layer (not illustrated) in place of the silicon substrate 101.

The second silicon nitride film 106 covers an inner wall of the contact hole 105 therewith. The second silicon nitride film 106 formed on an inner wall of the contact hole 105 prevents hydrogen diffusing into the silicon dioxide film 103 around the capacity device 100 from penetrating into the contact hole 105 through a peripheral surface thereof.

The plug 107 filling the contact hole 105 therewith is composed of polysilicon or metal such as tungsten. When the contact hole 105 is designed to reach the silicon substrate 101 (not a metal wiring layer), there may be formed a layer at a bottom of the contact hole 105 which layer is composed of metal silicide or a material acting as a diffusion barrier for semiconductor elements. For instance, such a layer may have a two-layered structure comprised of a titanium silicide layer and a titanium nitride layer.

The lower electrode 110 of the capacity device 100 is formed over the contact hole 105. When the contact hole 105 is filled with silicon, there are formed the second layer 109 composed of titanium nitride and acting as a diffusion barrier to silicon, and the first layer 108 composed of titanium silicide ($TiSi_2$) for reducing a junction resistance. The lower electrode 110 making contact with the capacitive film 111 is preferably composed of Pt, Ru, or Ir. As an alternative, the lower electrode 110 may be composed of a metal oxide having a low electric resistance such as $RuO_2$ and $IrO_2$, or may have a multi-layered structure including a layer composed of such a metal oxide.

The lower electrode 110 is covered with the capacitive film 111 and further with the upper electrode layer 112. The capacitive film 111 is composed of $Ta_2O_5$, for instance. As an alternative, the capacitive film 111 may be composed of high-dielectric or ferroelectric substance such as (Ba, Sr)$TiO_3$ and $SrTiO_3$. The upper electrode layer 112 may be composed of Pt, Au, Ru or TiN.

The upper electrode layer 112 is covered at an upper surface thereof with the third silicon nitride film 113. The capacitive film 111 and the upper electrode layer 112 are covered at end surfaces thereof with the fourth silicon nitride film 114.

Figure 3:
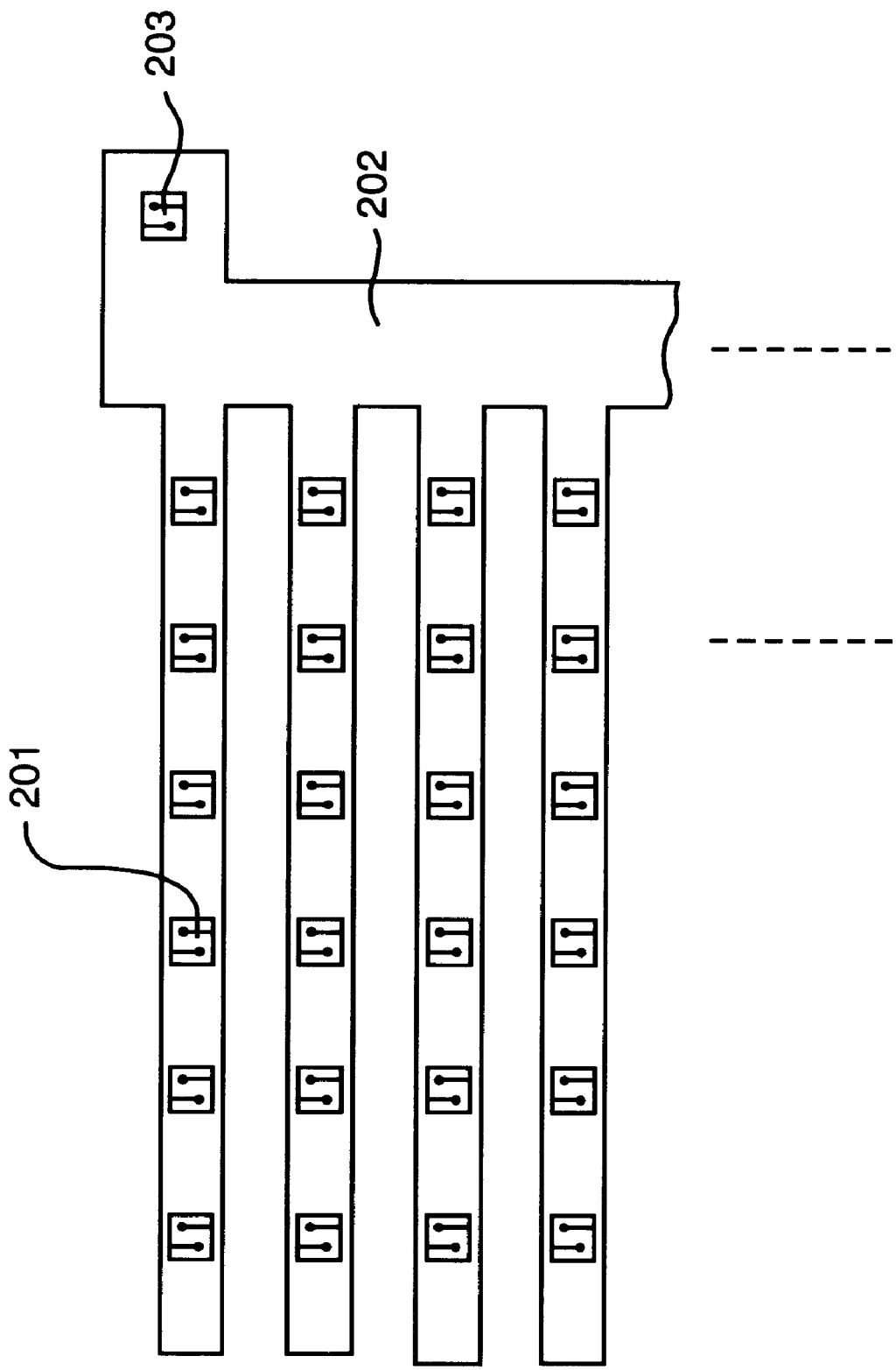
FIG. 3 is a plan view illustrating an upper electrode of capacity devices, and an external wiring layer.

FIG. 3 illustrates a positional relationship between an upper electrode and an external wiring layer.

As illustrated in FIG. 3, an upper electrode layer 202 and an external wiring layer 203 are positioned not above capacity devices 201, but positioned remote from each of the capacity devices 201 or a region where a plurality of the capacity devices 201 are arranged. If the upper electrode layer 202 is formed just above the capacity device 201, the third silicon nitride film 113 has to be formed with a hole for connecting to the upper electrode 202, which would cause a problem that hydrogen could readily penetrate the capacity device 201 during thermal annealing in hydrogen atmosphere. It is possible to prevent degradation of a capacity device by covering a capacity device at upper and side surfaces thereof with a silicon nitride film, and further by positioning the upper electrode 202 and the external wiring layer 203 remote from a capacity device or capacity devices.

As explained so far, the semiconductor device in accordance with the first embodiment makes it possible to avoid degradation of a capacity device caused by hydrogen by forming silicon nitride films at upper, side and lower surfaces of the capacity device, and an inner wall of a contact hole in connection with a lower surface of the capacity device.

Hereinbelow is explained a method of fabricating the semiconductor device illustrated in FIGS. 2 and 3, with reference to FIGS. 4A to 4J.

First, as illustrated in FIG. 4A, there is prepared a p-type silicon substrate 301. There may be prepared a silicon substrate on which an insulating film and a metal wiring layer are formed, in place of the p-type silicon substrate 301. Insulating films are formed at a surface of the p-type silicon substrate 301 in selected regions to thereby define device formation regions therebetween. Regions into which impurities are heavily doped are also separated into several sections when device formation regions are defined.

Then, a multi-layered interlayer insulating film is formed on the p-type silicon substrate 301. The multi-layered interlayer insulating film has a first silicon nitride film as an uppermost layer. In this embodiment, the multi-layered interlayer insulating film is comprised of a silicon dioxide film 302 and a first silicon nitride film 303. Then, as illustrated in FIG. 4A, the silicon dioxide film 302 and the first silicon nitride film 303 are formed in a selected region with a contact hole 304 by means of photolithography and dry etching.

Then, as illustrated in FIG. 4B, a second silicon nitride film 305 is formed all over the produce by chemical vapor deposition (CVD). Then, as illustrated in FIG. 4C, the thus formed second silicon nitride film 305 is etched back, resulting in that a sidewall composed of silicon nitride is formed on an inner wall of the contact hole 304.

Then, as illustrated in FIG. 4D, the electrically conductive plug 306 is formed in the contact hole 304. Specifically, a polysilicon film is deposited all over the product by CVD so that the contact hole 304 is filled with polysilicon, and then the polysilicon film located on the first silicon nitride film 303 is etched back. As an alternative, there may be employed a mask for removing unnecessary portions of the polysilicon film. Impurities may be introduced into the polysilicon film when the polysilicon film is formed by CVD, to thereby cause the plug 306 to have the same electrical conductivity as that of a highly impurity-doped region having been in advance formed in the silicon substrate 301, which ensures reduction of a parasitic resistance at a contact through which the plug 306 makes contact with the silicon substrate 301.

As an alternative, impurities may be introduced into the polysilicon film by ion-implantation after the formation thereof. As illustrated in FIG. 4E, if a metal wiring layer is exposed at a bottom of the contact hole 304, there may be formed a silicon-diffusion barrier layer over the produce in order to prevent reaction between silicon and the metal wiring layer. For instance, such a silicon-diffusion barrier layer may be a titanium nitride (TiN) layer or a titanium silicide 307/titanium nitride 308 (TiSi$_2$/TiN) layer, as illustrated in FIG. 4E. As an alternative, a Ti/TiN film may be first formed over the contact hole 304, and then be thermally annealed to thereby turn only an upper portion of the plug 306 into silicide.

The contact hole 304 may be filled with metal such as tungsten. When a substrate appearing at a bottom of the contact hole 304 is silicon, a barrier layer composed of Ti/TiN may be formed between the substrate and a plug in order to prevent reaction between silicon and metal filling the contact hole 304 therewith.

Figure 5:
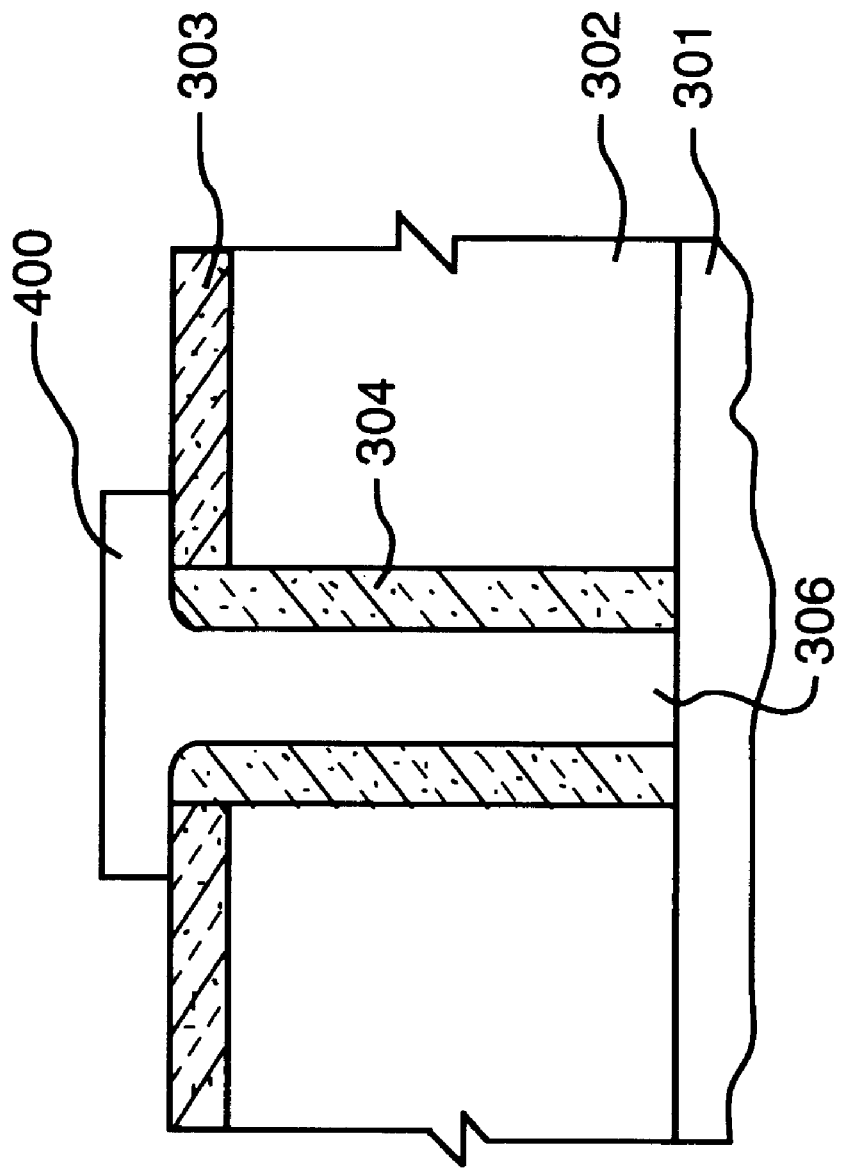
FIG. 5 is a cross-sectional view illustrating a plug.

As illustrated in FIG. 5, the plug 306 may be designed to have a projecting portion 400 beyond an upper surface of the first silicon nitride film 303. The projection portion 400 may be formed by employing a mask to remove a portion of a polysilicon film located on the first silicon nitride film 303.

Then, as illustrated in FIGS. 4E and 4F, there is formed a lower electrode layer 309 over the silicon-diffusion barrier layer 307 and 308. The lower electrode layer 309 is composed of Pt, Ru, Ir, RuO$_2$ or IrO$_2$. Thereafter, as illustrated in FIG. 4G, a capacitive insulating film 310, an upper electrode layer 311, and a third silicon nitride film 312 are successively formed all over the product.

Then, an unnecessary portion of the capacitive insulating film 310, the upper electrode layer 311, and the third silicon nitride film 312 is etched for removal by using a mask until the first silicon nitride film 303 is exposed, as illustrated in FIG. 4H. There may be selected reactive dry etching or ion milling with inert gas being used.

Then, as illustrated in FIG. 4I, a fourth silicon nitride film 313 is formed all over the product. The fourth silicon nitride film 313 is etched back to thereby form a sidewall covering end surfaces of the capacitive insulating film 310, the upper electrode layer 311, and the third silicon nitride film 312 therewith, as illustrated in FIG. 4J.

Then, there is formed an insulating film (not illustrated) all over the product for electrically insulating from an external wiring layer. Then, there is formed a second contact hole (not illustrated) throughout the insulating film to electrically connect the thus fabricated capacity device to the external wiring layer.

[Second Embodiment]

Figure 6:
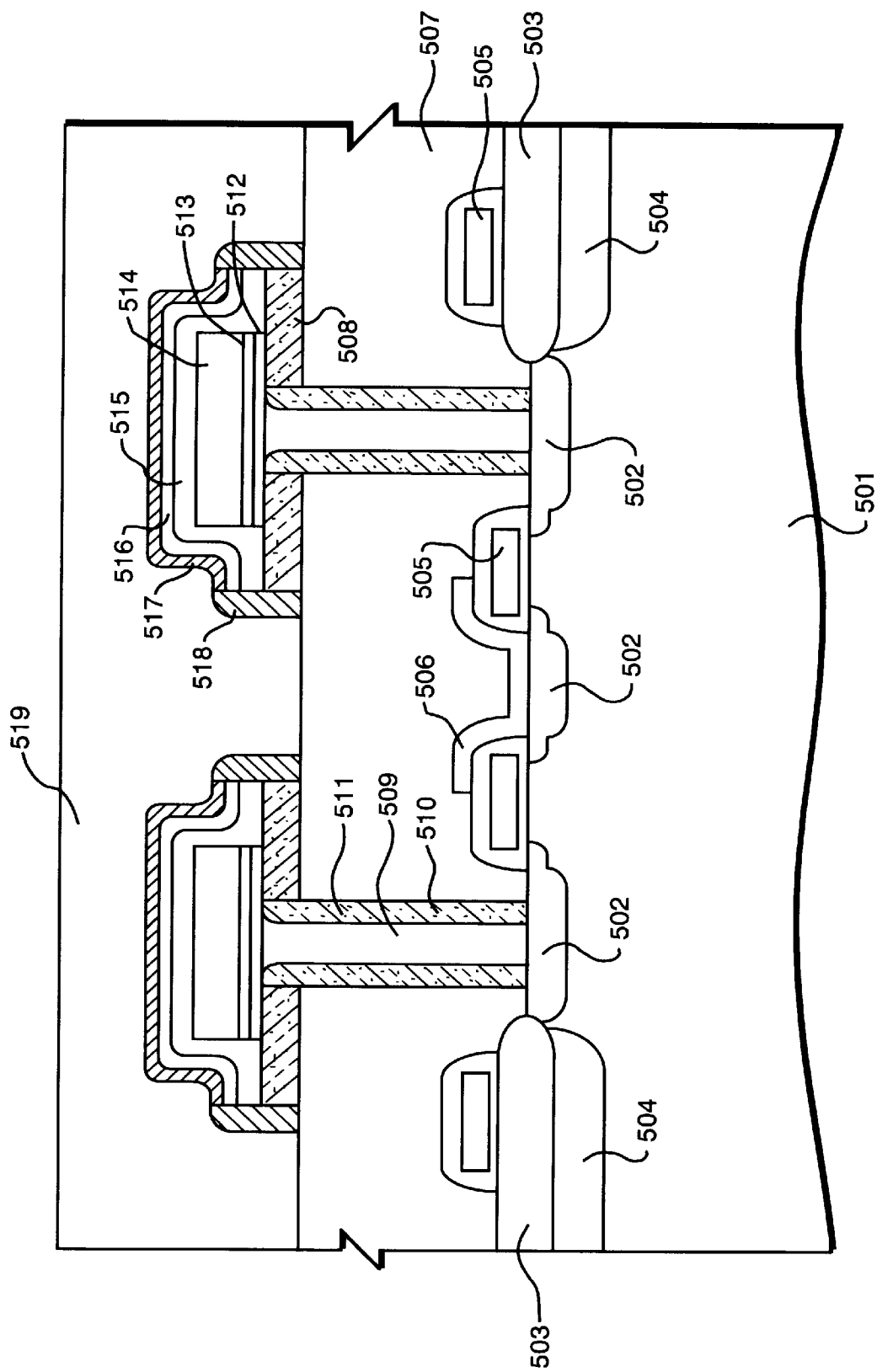
FIG. 6 is a cross-sectional view of a semiconductor device in accordance with the second embodiment of the present invention.

FIG. 6 illustrates a semiconductor device in accordance with the second embodiment of the present invention.

As illustrated in FIG. 6, insulating films 503 are formed at a surface of a semiconductor substrate 501 to thereby define device formation regions therebetween. Gate electrodes 505 of field effect transistors (FET) are arranged at a certain interval on a surface of the semiconductor substrate 501. The semiconductor substrate 501 is formed at a surface thereof with source/drain regions 502 above some of which are formed the above-mentioned capacity devices 100 illustrated in FIG. 2. Elements formed on the insulating films 503 extend perpendicularly to a plane of the drawing.

The semiconductor substrate 501 is composed of p- or n-type silicon. If necessary, a well having certain conductivity may be formed in the semiconductor substrate 501 by ion-implantation.

The insulating films 503 define device formation regions therebetween where a field effect transistor is formed comprising the gate electrode 505, a gate insulating film sandwiched between the gate electrode 505 and the semiconductor substrate 501, and the source and drain regions 502 around the gate electrode 505. The gate electrode 505 may be composed of polysilicon into which impurities are introduced, or may have a multi-layered structure comprising a polysilicon layer into which impurities are introduced, a metal silicide layer, and a polysilicon layer. A bit line or a signal line 506 is formed on the source/drain region 502.

Over the field effect transistor are formed an interlayer insulating film 507 and a first silicon nitride film 508. There are formed first contact holes 509 throughout the first silicon nitride film 508 and the interlayer insulating film 507 for electrically connecting capacity devices to the source/drain regions 502 of the transistors.

A second silicon nitride film 510 is formed on an inner wall of each of the contact holes 509.

A plug 511 composed of metal such as polysilicon and tungsten is formed in each of the contact holes 511. Similarly to the first embodiment, when the contact hole 509 reaches the semiconductor substrate 501, it is preferable to form a diffusion barrier layer at a bottom of the contact hole 509 in order to prevent diffusion of metal silicide and semiconductor atoms. For instance, such a diffusion barrier layer may be designed to have a two-layered structure of a titanium silicide layer and a titanium nitride layer.

A lower or storage electrode 514 of the capacity device is formed over the contact hole 509. When the contact hole 509 is filled with silicon, there are formed a second layer 513 composed of titanium nitride and acting as a diffusion barrier to silicon, and a first layer 512 composed of titanium silicide (TiSi$_2$) for reducing a junction resistance. The lower electrode 514 making contact with a later mentioned capacitive film 515 is preferably composed of Pt, Ru, or Ir. As an alternative, the lower electrode 514 may be composed of a metal oxide having a low electric resistance such as $RuO_2$ and $IrO_2$, or may have a multi-layered structure including at least a layer composed of such a metal oxide.

The lower electrode 514 is covered with a capacitive film 515 and further with an upper electrode layer 516. The capacitive film 515 is composed of tantalum oxide, $Ta_2O_5$, for instance. As an alternative, the capacitive film 515 may be composed of high-dielectric or ferroelectric substance such as $(Ba, Sr)TiO_3$ and $SrTiO_3$. The upper electrode layer 516 may be composed of Pt, Au, Ru or TiN.

The upper electrode layer 516 is covered at an upper surface thereof with a third silicon nitride film 517. The capacitive film 515 and the upper electrode layer 516 are covered at end surfaces thereof with a fourth silicon nitride film 518.

An interlayer insulating film 519 is formed all over the product for electrically insulating from an external wiring, and second contact holes (not illustrated) are formed throughout the interlayer insulating film 519 for electrically connecting the external wiring to the capacity device. The location of the second contact holes is the same as the location having been explained with reference to FIG. 3.

A method of fabricating a semiconductor device in accordance with the above-mentioned second embodiment is almost the same as the method having been explained with reference to FIGS. 4A to 4J. Hereinbelow is explained a specific embodiment of a method of fabricating a semiconductor device in accordance with the second embodiment.

Figure 7A:
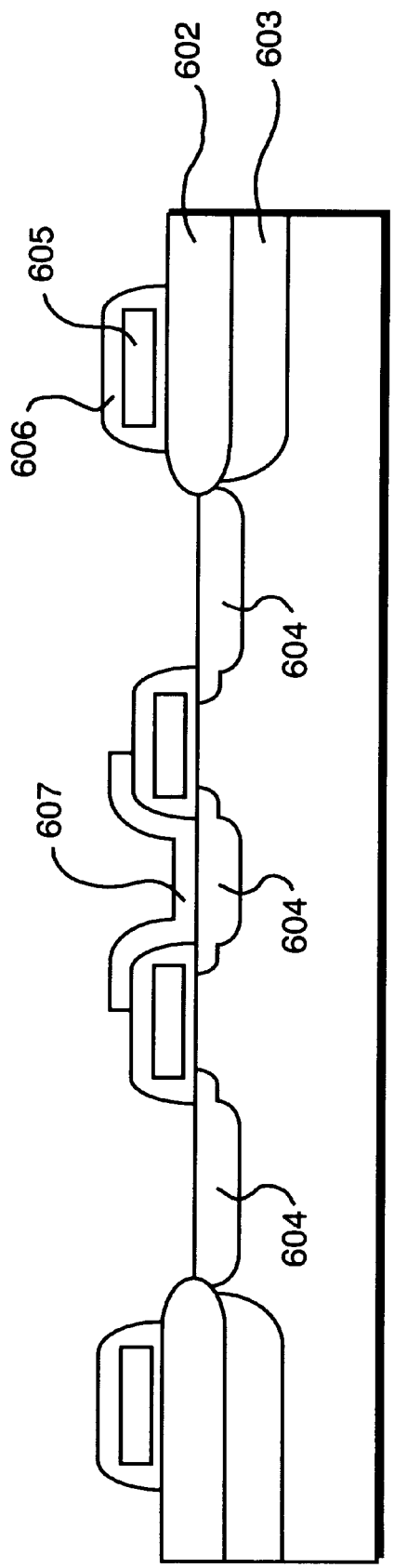
FIGS. 7A to 7F are cross-sectional views of a semiconductor device in accordance with the second embodiment, each illustrating respective step of a method of fabricating the same.

FIGS. 7A to 7F illustrates a method of fabricating a semiconductor device in accordance with the second embodiment. As illustrated in FIG. 7A, silicon dioxide films as insulating films 602 are formed at a surface of a p-type silicon substrate 601 by local oxide of silicon (LOCOS) process, improved LOCOS process, or a groove-separation process, to thereby define device formation regions between the insulating films 602. The silicon dioxide films 602 has a thickness of 350 nm. Below the insulating films 602 are formed channel stoppers 603.

Then, a silicon dioxide film as a gate oxide film is grown by a thickness of 10 nm. A polysilicon film of which a gate electrode 605 will be made is formed over the product by a thickness of 200 nm. Then, the polysilicon film is patterned by photolithography and dry etching to thereby define the gate electrodes 605. Around the gate electrodes 605 are formed sidewall films 606. The gate electrode 605 may be designed to have a multi-layered structure comprising either a metal layer and a polysilicon layer, or a metal silicon layer and a polysilicon layer, to thereby reduce a layer resistance of the gate electrode 605, which ensures enhancement of circuit performance.

The semiconductor substrate 601 is ion-implanted with phosphorus ions or arsenic ions to thereby form source/drain regions 604. A bit line 607 is formed on the source/drain region 604. The bit line 607 is composed of polysilicon or metal silicide.

Figure 7B:
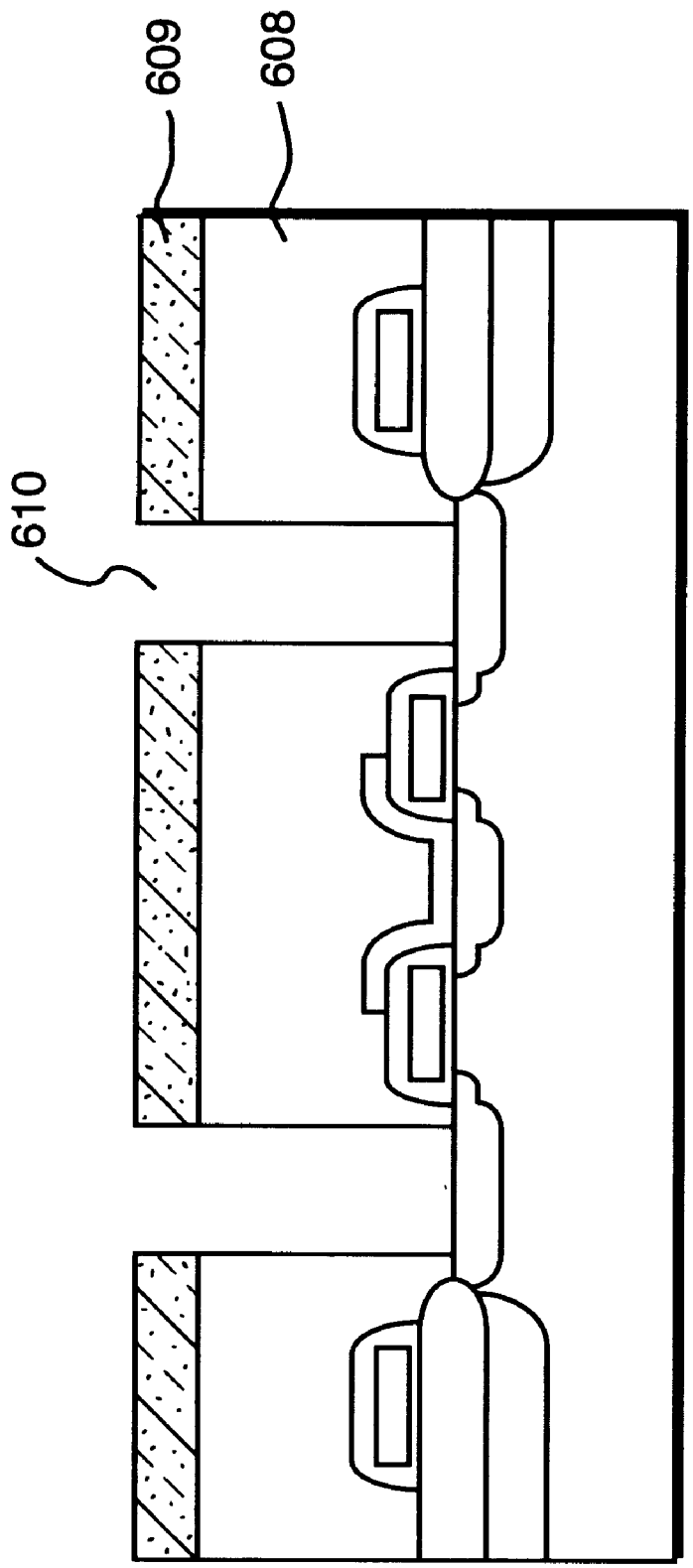

Then, as illustrated in FIG. 7B, an interlayer insulating film is formed over the product. The interlayer insulating film is comprised of a silicon dioxide film 608 and a first silicon nitride film 609. The silicon dioxide film 608 is formed by CVD where silane or TEOS is used as a process gas. The first silicon nitride film 609 is formed by CVD by a thickness of 200 nm. The interlayer insulating film is formed at selected regions with contact holes 610 by means of photolithography and dry etching.

Figure 7C:
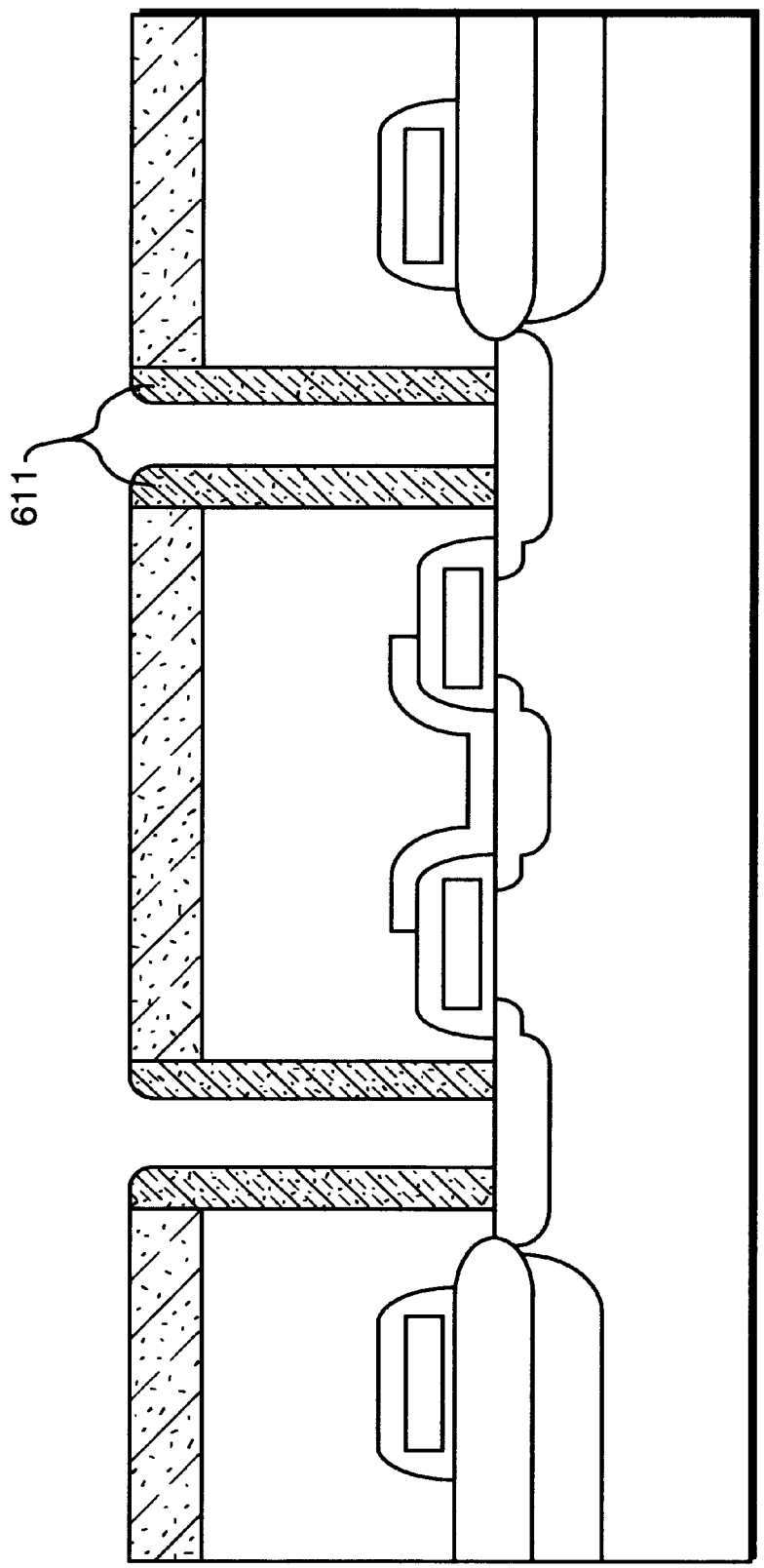

Then, as illustrated in FIG. 7C, a second silicon nitride film 611 is formed all over the product by a thickness of 50 nm, followed by anisotropic dry etching to thereby etch back the second silicon nitride film 611. As a result, the second silicon nitride film 611 is formed only on an inner wall of each of the contact holes 610.

Then, a polysilicon film is formed all over the product. The polysilicon film is etched back to thereby form a plug layer 612 in each of the contact holes 610. It is preferable that the polysilicon film is formed by CVD where gaseous impurities such as phosphine gas is simultaneously used, to thereby introduce impurities such as phosphorus into the polysilicon film for reducing a resistance of the plug layer 612.

As a diffusion barrier layer to silicon, a titanium silicide layer 613 and a titanium nitride layer 614 are formed on the first silicon nitride film 609 above each of the contact holes 610. Then, a lower electrode layer 615 composed of Ru is formed over the titanium nitride layer 614 by a thickness of 200 nm. The lower electrode layer 614 is preferably composed of a metal such as Ru which has electrical conductivity even if oxidized. However, reaction between materials of which the plug layer 612 and the lower electrode layer 615 are composed is to be taken into consideration. If the plug layer 612 is composed of silicon, silicon reacts with a material of which the lower electrode layer 615 is composed, to thereby not only produce silicide, but also pass through the lower electrode layer 615 and react with a later mentioned capacitive film with the result of deterioration of performance of a capacitive film.

Figure 7D:
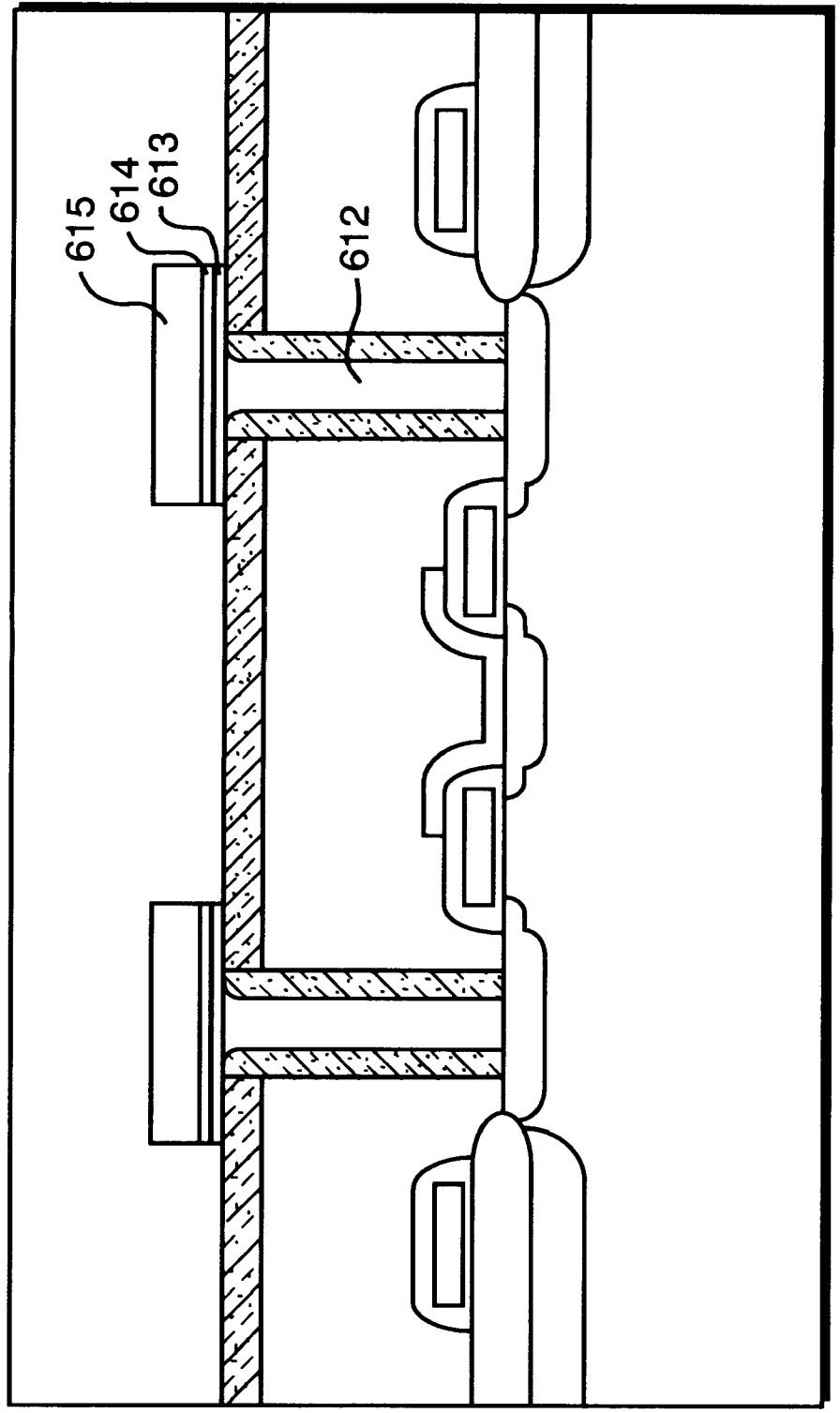

As illustrated in FIG. 7D, the lower electrode layer 615 is patterned by means of either photolithography and dry etching or ion milling to thereby define lower electrodes.

Figure 7E:
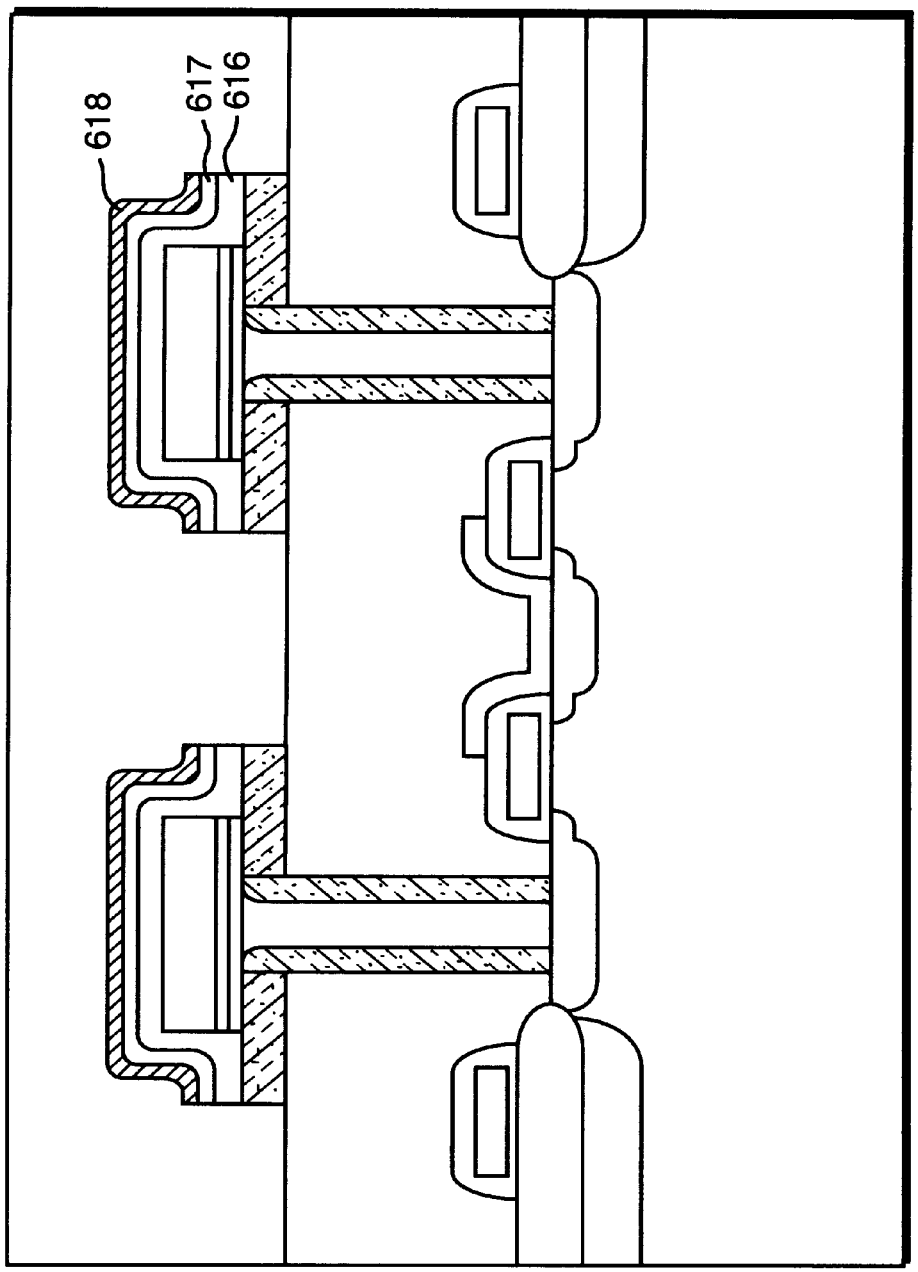
Figure 7F:
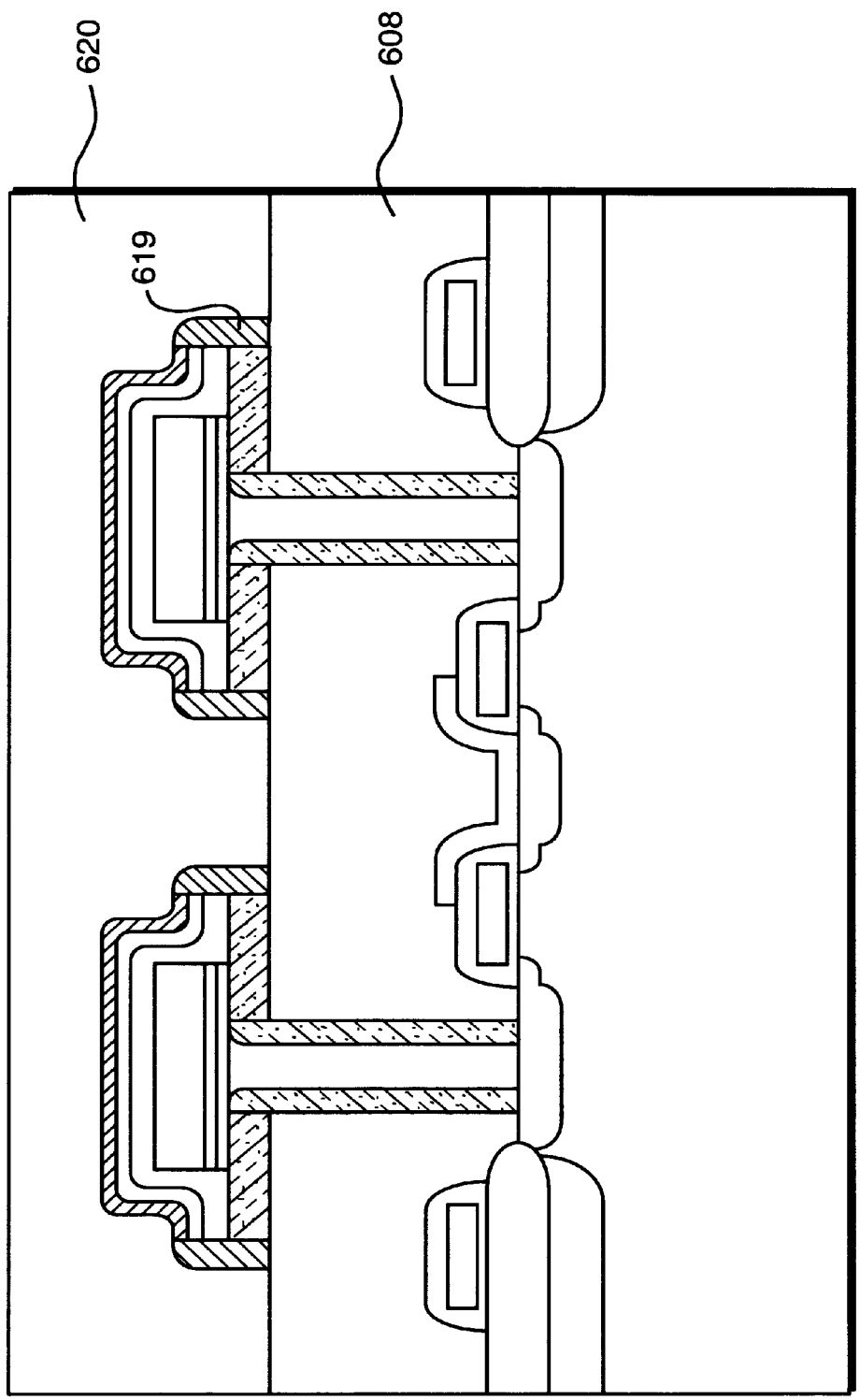

Then, as illustrated in FIG. 7E, a capacitive film composed of BST is formed all over the product by a thickness of 30 nm by MO-CVD or thermal CVD, for instance. When the lower electrodes 615 are planar, the capacitive film 616 may be formed by sputtering or Sol-Gel method. Subsequently, an upper electrode layer 617 composed of Pt is formed over the product by sputtering by a thickness of 10 nm. The upper electrode layer 617 may be composed of Ru, W, or TiN.

A third silicon nitride film 618 is formed over the upper electrode layer 617 by CVD by a thickness of 100 nm. Then, the capacitive film 616, the upper electrode layer 617, and the third silicon nitride film 618 are patterned by means of photolithography and dry etching, as illustrated in FIG. 7E.

Then, as illustrated in FIG. 4F, a fourth silicon nitride film 619 is formed all over the product by a thickness of 100 nm, followed by etching back until the interlayer insulating film 608 is exposed. Thus, a capacity device is covered at a side surface thereof with the fourth silicon nitride film 619. Then, an interlayer insulating film 620 composed of BPSG is formed all over the product by a thickness of 500 nm. The interlayer insulating film 620 may be formed of a silicon dioxide ($SiO_2$) film using TEOS as a process gas.

Then, there are formed contact holes (not illustrated) throughout the interlayer insulating film 620 for electrically connecting an external wiring to the upper electrode 617 of the capacity device. The location of the contact holes is determined as having been explained with reference to FIG. 3.

[Third Embodiment]

FIGS. 8A to 8D illustrate a semiconductor device in accordance with the third embodiment where a plurality of capacity devices is arranged on a semiconductor substrate. Hereinbelow is explained a method of fabricating a semiconductor device in accordance with the third embodiment.

An interlayer insulating film 701 is formed on a semiconductor substrate (not illustrated). A semiconductor substrate on which a wiring layer is formed may be used instead. The semiconductor substrate is covered at an upper surface thereof with a first silicon nitride film 702. A plurality of contact holes 703 are formed throughout the first silicon nitride film 702 and the interlayer insulating film 701. Each of the contact holes 703 is filled with a plug layer 705. A second silicon nitride film 704 is formed on an inner wall of each of the contact holes 703.

A titanium silicide ($TiSi_2$) film 706, a titanium nitride (TiN) film 707, a lower electrode layer 708, a capacitive film 709, an upper electrode layer 710, and a third silicon nitride film 711 are formed in the same process as the process having been explained with reference to FIGS. 7A to 7F.

Figure 8A:
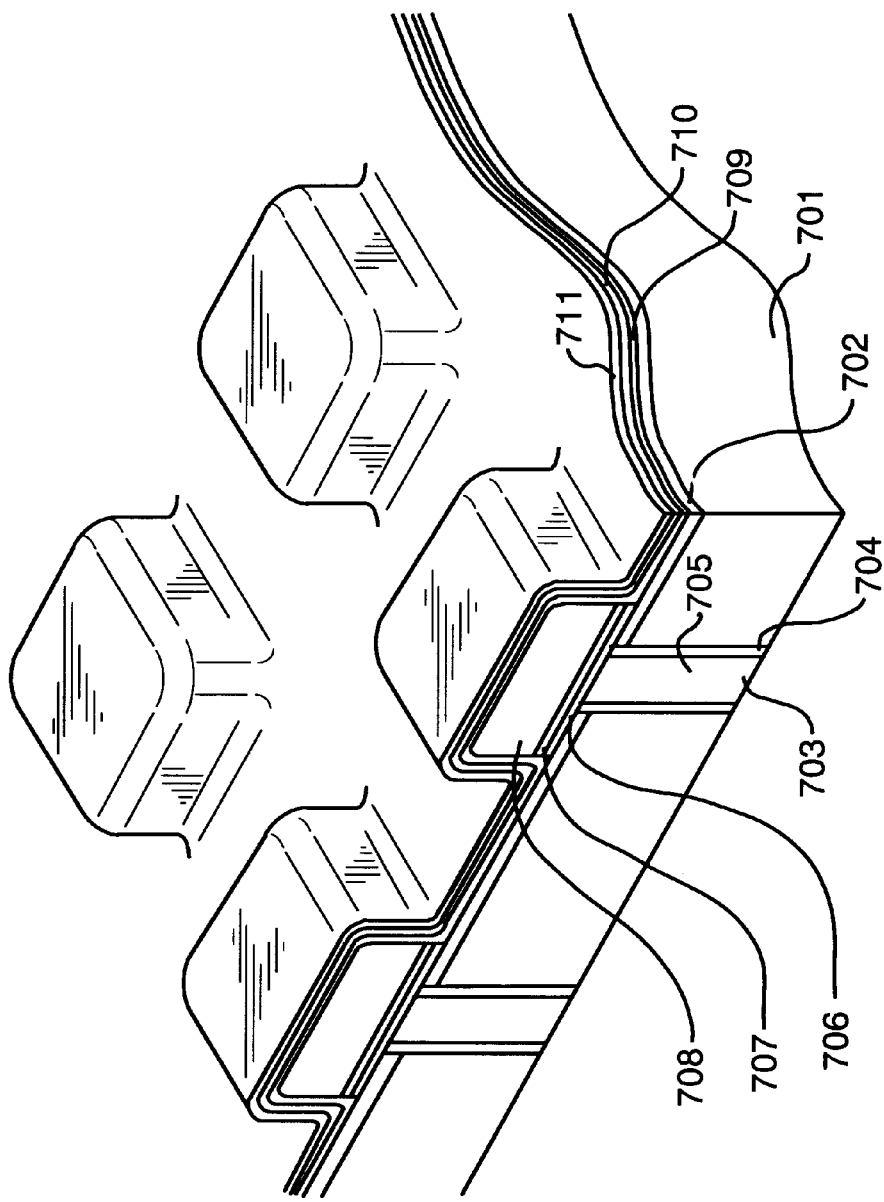
FIGS. 8A to 8D are perspective views illustrating a semiconductor device in accordance with the third embodiment, each illustrating respective step of a method of fabricating the same.

A plurality of the lower electrodes 708 of the capacity devices is regularly arranged on the interlayer insulating film 701. However, it should be noted that the capacitive film 709, the upper electrode layer 710, and the third silicon nitride film 711 are shared by a plurality of the capacity devices, as illustrated in FIG. 8A.

Figure 8B:
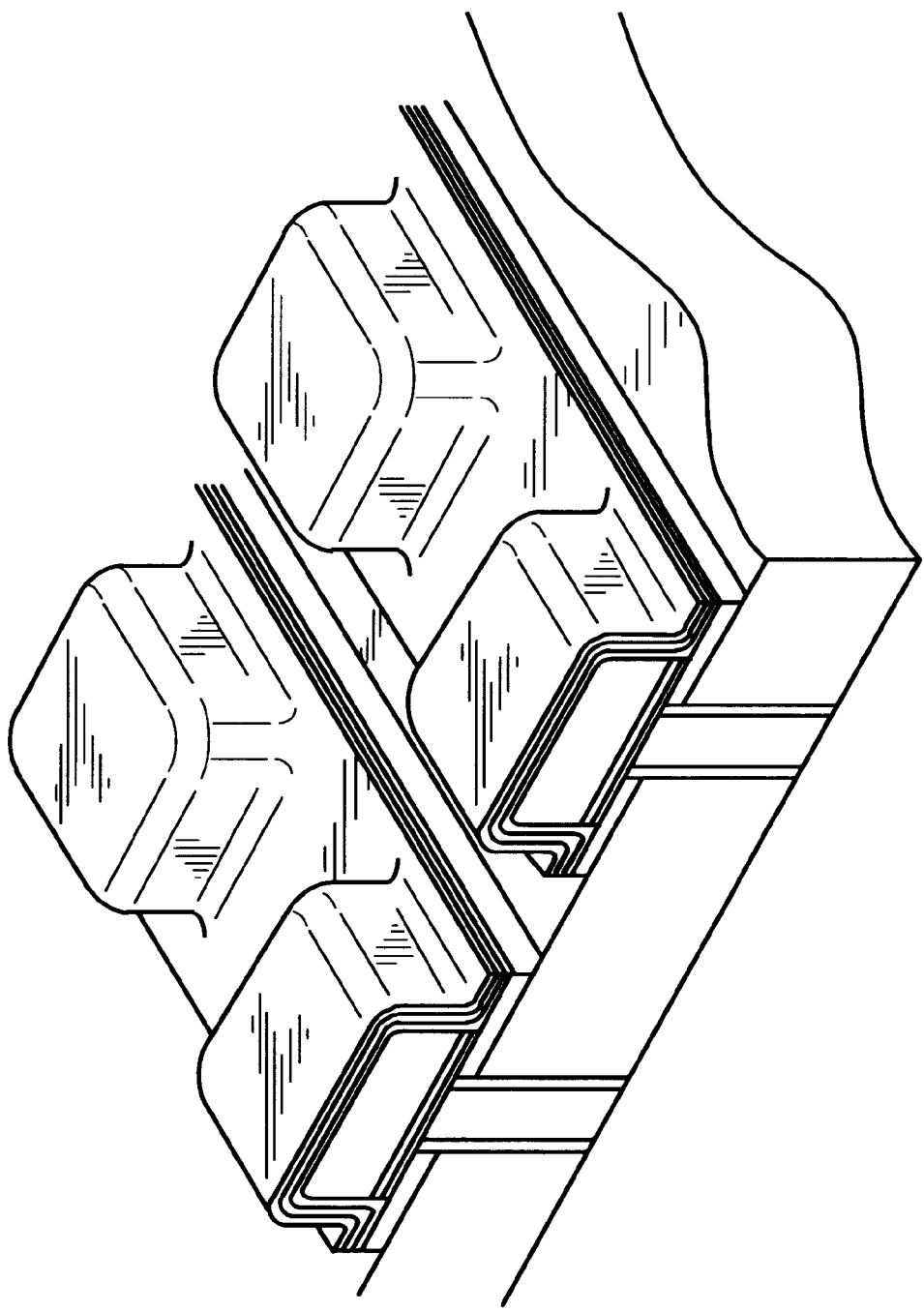

Then, the third silicon nitride film 711, the upper electrode 710, the capacitive layer 709, and the first silicon nitride film 702 are partially removed in a selected region in a certain direction by photolithography and dry etching, as illustrated in FIG. 8B. It is not necessary to completely remove the first silicon nitride film 702. Dry etching may be carried out at least until a surface of the first silicon nitride film 702 is exposed.

Figure 8C:
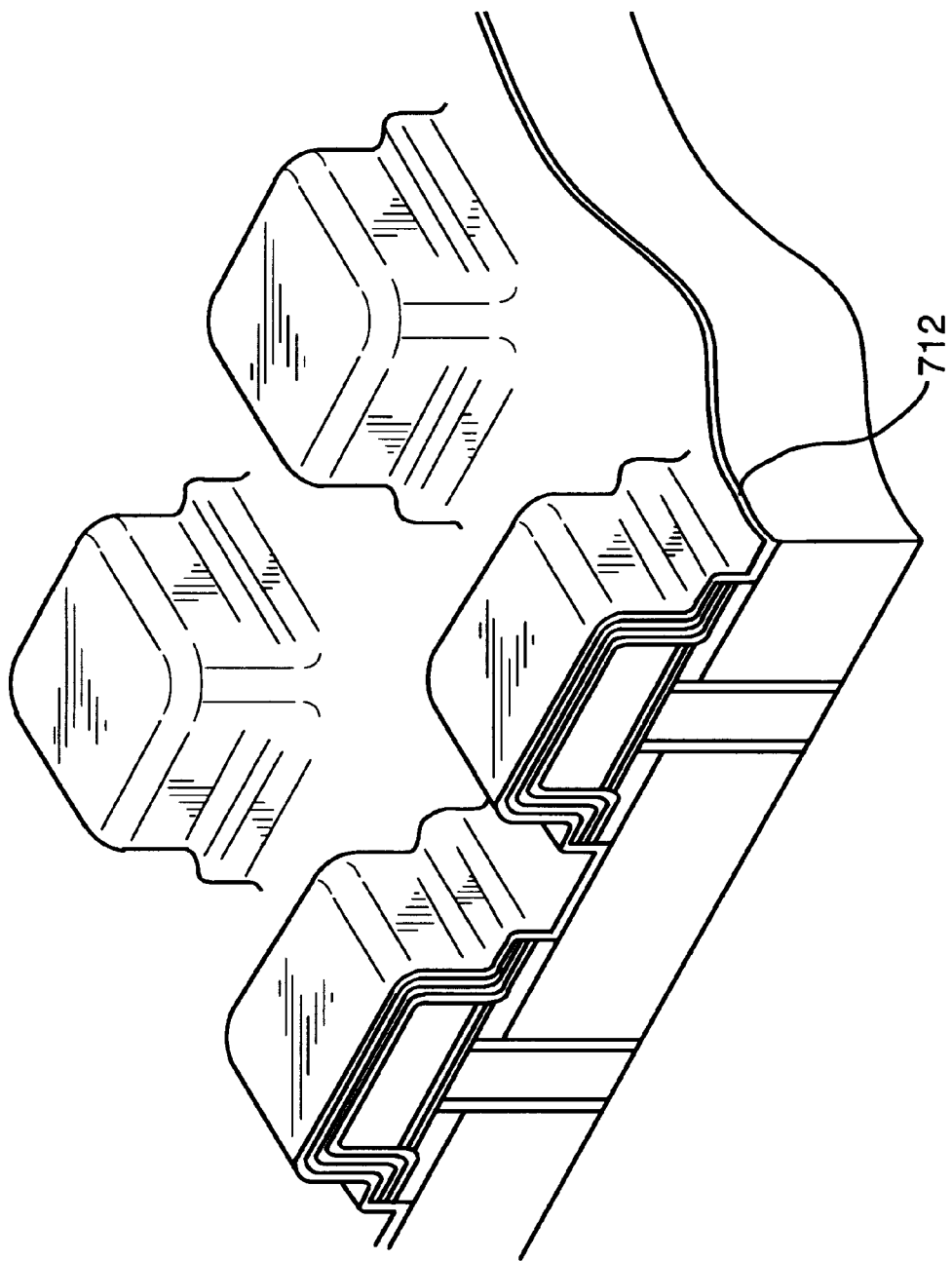
Figure 8D:
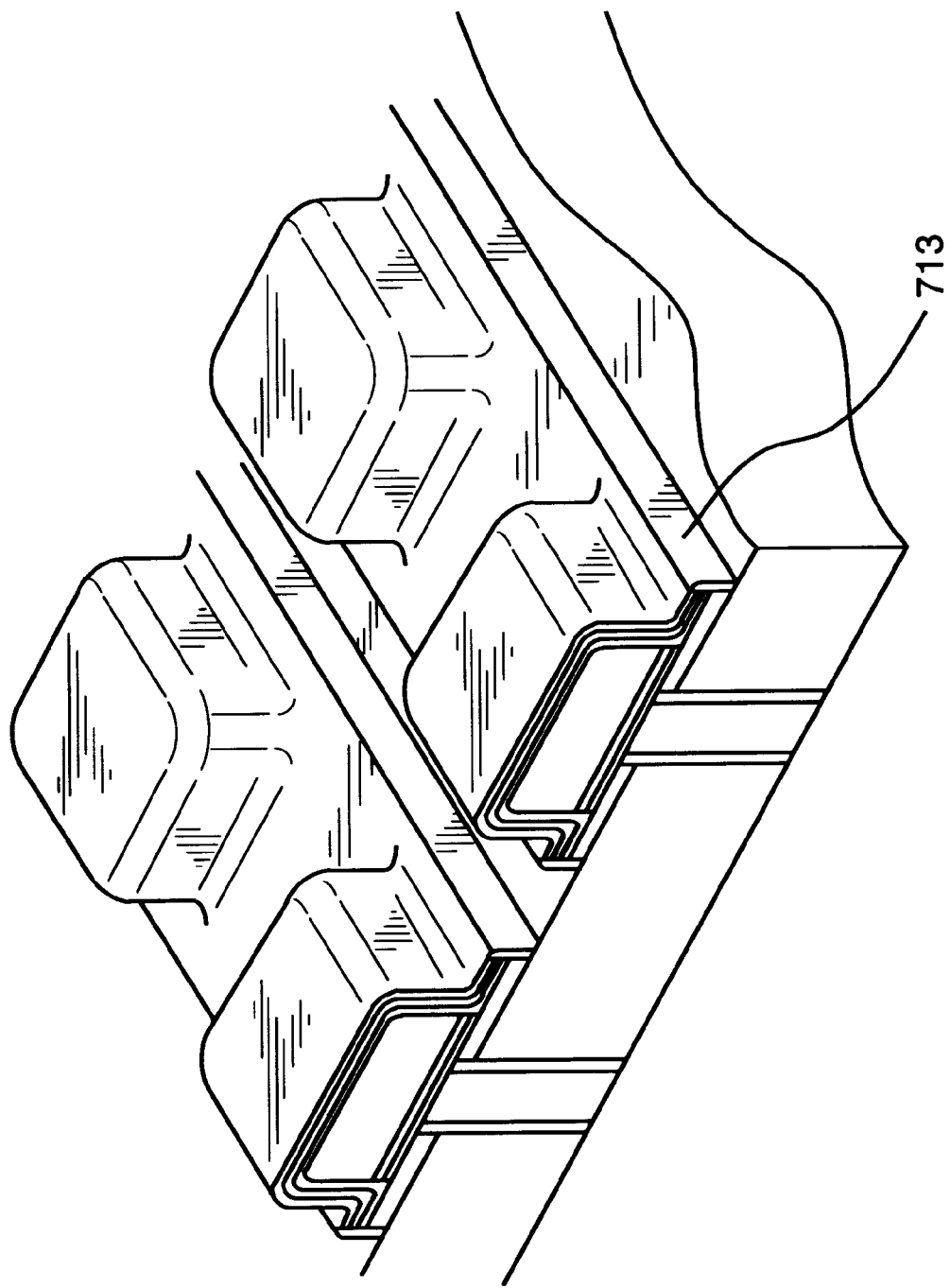

Then, a fourth silicon nitride film 712 is formed all over the product, as illustrated in FIG. 8C. Thereafter, the fourth silicon nitride film 712 is etched back until the interlayer insulating film or silicon dioxide film 701 is exposed, as illustrated in FIG. 8D. Thus, the capacity devices arranged in a row are covered at end surfaces thereof with the fourth silicon nitride film 712.

As having been described in connection with the preferred embodiments, in accordance with the present invention, a capacity device having a capacitive film composed of metal oxide readily reduced by hydrogen is entirely covered with first to fourth silicon nitride films. Hence, it is possible to avoid the capacitive film from being reduced, which ensures that the capacitive film is not deteriorated, and that there is presented a high-performance capacity device having a low leakage current and a high capacity.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-224950 filed on Aug. 21, 1997 including specification, claims, drawings and summary is incorporated herein by reference in its entirety.

What is claimed is:

1. A method of fabricating a semiconductor device, comprising the steps of:

(a) forming a multi-layered interlayer insulating film on a semiconductor substrate, said multi-layered interlayer insulating film including a first film, as an uppermost film, composed of a first material through which hydrogen is not allowed to pass;

(b) forming a plurality of contact holes in a row through said multi-layered interlayer insulating film to said semiconductor substrate;

(c) forming a second film on an inner wall of said contact holes, said second film being composed of a second material through which hydrogen is not allowed to pass;

(d) forming a plug layer in said contact holes, said plug layer being composed of an electrically conductive material;

(e) forming a lower electrode on said semiconductor substrate over said plug layer in such a manner that said lower electrode is more extensive than a cross-section of said contact holes;

(f) forming a capacitive film entirely covering said lower electrode therewith and further covering said first film therewith;

(g) forming an upper electrode over said capacitive film;

(h) forming a third film on said upper electrode;

(i) etching said third film in such a manner that an end surface of said third film, a side surface of said upper electrode, a side surface of said capacitive film, and said first film are exposed, and that said upper electrode is co-owned by a plurality of said lower electrodes, said third film being composed of a third material through which hydrogen is not allowed to pass; and (j) forming a fourth film covering both said end surface of said third film and said side surface of said capacitive film therewith, said fourth film being composed of a fourth material through which hydrogen is not allowed to pass.

2. The method as set forth in claim 1, wherein said step (c) includes:

(c-1) forming said second film over said semiconductor substrate so that an inner wall of said contact holes is covered with said second film; and (c-2) etching said second film back so that only a portion of said second film deposited on said semiconductor substrate is removed.

3. The method as set forth in claim 1, wherein said step (j) includes:

(j-1) depositing said fourth film over said capacitive film and said first film; and (j-2) etching said fourth and first films so that an upper surface and said end surface of said third film, and said side surface of said capacitive film are covered with said fourth film.

4. The method as set forth in claim 1, wherein said first, second, third, and fourth materials are the same.

5. The method as set forth in claim 4, wherein said first, second, third, and fourth materials are nitride.

6. The method as set forth in claim 5, wherein said first, second, third, and fourth materials are silicon nitride.

7. The method as set forth in claim 3, wherein said capacitive film is composed of tantalum oxide.

8. The method as set forth in claim 3, wherein said capacitive film is composed of high dielectric or ferroelectric substance.

9. The method as set forth in claim 1, wherein said contact holes is formed in said step (b) so as to electrically connect said capacitive film to a source or drain region formed in said semiconductor substrate.

* * * * *